United States Patent
Ito (10) Patent No.: US 8,643,100 B2
(45) Date of Patent: Feb. 4, 2014

(54) FIELD EFFECT TRANSISTOR HAVING MULTIPLE EFFECTIVE OXIDE THICKNESSES AND CORRESPONDING MULTIPLE CHANNEL DOPING PROFILES

(75) Inventor: Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/398,255

(22) Filed: Feb. 16, 2012

(65) Prior Publication Data

US 2013/0214353 A1    Aug. 22, 2013

(51) Int. Cl.
  *H01L 29/78*    (2006.01)
  *H01L 21/336*   (2006.01)

(52) U.S. Cl.
  USPC ........... 257/336; 257/219; 257/221; 257/288; 257/327; 257/339; 257/343; 257/344; 257/369; 257/391; 257/408; 438/286; 438/289; 438/291

(58) Field of Classification Search
  USPC ......... 257/219, 221, 288, 327, 343, 344, 369, 257/391, 408; 438/286, 289, 291
  See application file for complete search history.

(56) References Cited

U.S. PATENT DOCUMENTS

| | | | | |
|---|---|---|---|---|
| 6,121,666 A | * | 9/2000 | Burr | 257/408 |
| 2010/0032732 A1 | * | 2/2010 | Booth et al. | 257/288 |

* cited by examiner

*Primary Examiner* — Matthew W Such
*Assistant Examiner* — David Spalla
(74) *Attorney, Agent, or Firm* — Sterne, Kessler, Goldstein & Fox P.L.L.C.

(57) ABSTRACT

A FET includes a gate dielectric structure associated with a single gate electrode, the gate dielectric structure having at least two regions, each of those regions having a different effective oxide thickness, the FET further having a channel region with at least two portions each having a different doping profile. A semiconductor manufacturing process produces a FET including a gate dielectric structure associated with a single gate electrode, the gate dielectric structure having at least two regions, each of those regions having a different effective oxide thickness, the FET further having a channel region with at least two portions each having a different doping profile.

18 Claims, 7 Drawing Sheets

FIELD EFFECT TRANSISTOR HAVING MULTIPLE EFFECTIVE OXIDE THICKNESSES AND CORRESPONDING MULTIPLE CHANNEL DOPING PROFILES

FIELD OF THE INVENTION

The present invention relates generally to the physical structure of the field effect transistor (FET), and processes for making same.

BACKGROUND

Advances in semiconductor manufacturing technologies have resulted in dramatically increased circuit packing densities and higher speeds of operation. In order to achieve such increased densities, a wide variety of evolutionary changes have taken place with respect to semiconductor processing techniques and semiconductor device structures over the years.

Many of these process and structural changes have been introduced in connection with device scaling, in which ever smaller device geometries have been achieved.

One consequence of conventional FET device scaling is a requirement to reduce operating voltages. The reduced operating voltages are required, at least in part, because conventional FET device scaling needs a thinner gate dielectric layer in order to produce the desired electrical characteristics in the scaled-down transistor. Without a reduction in operating voltage, the electric field impressed across the thinner gate dielectric during circuit operation can be high enough for dielectric breakdown to become a problem. In other words, scaled-down FETs may operate faster but they require operation at lower voltages.

It has been recognized that many integrated circuit designs require both low operating voltage FETs for their ability to operate at high speeds, and high operating voltage FETs for their ability to interface with high voltage signals provided by other electronic components. In response to this need manufacturers have developed and provided semiconductor manufacturing processes that offer two types of transistors for use within a single integrated circuit. These two types of transistors include a first type with low operating voltage and high speed, and a second type with a higher operating voltage and a lower speed.

Unfortunately, these semiconductor manufacturing processes do not provide FETs with the electrical characteristics of high speed and high operating voltage combined in a single device.

What is needed are semiconductor structures suitable for use as FETs in radio frequency (RF) applications with high operating voltages and high transistor $f_T$.

BRIEF DESCRIPTION OF THE DRAWINGS

Embodiments of the invention are described with reference to the accompanying drawings. In the drawings, like reference numbers indicate identical or functionally similar elements. Additionally, the left most digit(s) of a reference number identifies the drawing in which the reference number first appears.

It is noted that the cross-sectional representations of various semiconductor structures shown in the figures are not necessarily drawn to scale, but rather, as is the practice in this field, drawn to promote a clear understanding of the structures and process steps which they are illustrating.

DETAILED DESCRIPTION

The following Detailed Description refers to accompanying drawings to illustrate exemplary embodiments consistent with the invention. References in the Detailed Description to "one exemplary embodiment," "an illustrative embodiment", "an exemplary embodiment," and so on, indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Terminology

The terms, chip, die, integrated circuit (IC), semiconductor device, and microelectronic device, are often used interchangeably in the field of electronics. The present invention is applicable to all the above as these terms are generally understood in the field.

With respect to chips, it is common that power, ground, and various signals may be coupled between them and other circuit elements via physical, electrically conductive connections. Such a point of connection may be referred to as an input, output, input/output (I/O), terminal, line, pin, pad, port, interface, or similar variants and combinations. Although connections between and amongst chips are commonly made by way of electrical conductors, those skilled in the art will appreciate that chips and other circuit elements may alternatively be coupled by way of, but not limited to, optical, mechanical, magnetic, electrostatic, and electromagnetic interfaces.

The terms metal line, trace, wire, interconnect, conductor, signal path and signaling medium are all related. The related terms listed above, are generally interchangeable, and appear in order from specific to general. In this field, metal lines are sometimes referred to as traces, wires, lines, interconnect or simply metal. Metal lines, such as, but not limited to, aluminum (Al), copper (Cu), an alloy of Al and Cu, an alloy of Al, Cu and silicon (Si), tungsten (W), nickel (Ni), titanium nitride (TiN), and tantalum nitride (TaN) are conductors that provide signal paths for interconnecting electrical circuitry. Other conductors, both metal and non-metal are available in microelectronic devices. Materials such as doped polysilicon, doped single-crystal silicon (often referred to simply as diffusion, regardless of whether such doping is achieved by thermal diffusion or ion implantation), titanium (Ti), cobalt (Co), molybdenum (Mo), and refractory metal silicides are examples of other conductors.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly. It is noted that polysilicon is commonly used to form the gate electrode of a FET. An alternative use of polysilicon is as a sacrificial gate electrode that is removed and replaced with a metal gate during the manufacturing process.

Epitaxial layer refers to a layer of single crystal semiconductor material. In this field, an epitaxial layer is commonly referred to "epi."

FET, as used herein, refers to a metal-oxide-semiconductor field effect transistor (MOSFET). An n-channel FET is referred to herein as an NFET. A p-channel FET is referred to herein as a PFET. FETs that are formed in a bulk substrate, such as a silicon wafer, have four terminals, namely gate, drain, source and body.

Effective oxide thickness refers to the thickness of a layer of $SiO_2$ that is electrically equivalent to a given thickness of a material having a given dielectric constant. In many circumstances it is the electrical characteristic of a dielectric layer (which is proportional to layer thickness/dielectric constant) that is of interest rather than the actual physical thickness of the layer. Historically the gate dielectric layer was formed almost exclusively from silicon dioxide, however that is no longer the case in the semiconductor industry. Since there are a variety of materials now in use as gate dielectrics, it is easier for the sake of comparison to discuss these gate dielectrics in terms of a normalized value such as effective oxide thickness. By way of example, since $HfO_2$ has a dielectric constant of 25 (compared to 3.9 for $SiO_2$), a 6.4 nm layer of $HfO_2$ has an effective oxide thickness of 1 nm. In other words, a high dielectric constant material can be electrically equivalent to a thinner layer of lower dielectric constant material.

As used herein, "gate" refers to the insulated gate terminal of a FET. The physical structure of the gate terminal is referred to as a gate electrode. In terms of the layout of an integrated circuit, the gate electrode is the logical AND of the polysilicon layer with the layer representing an active portion of the semiconductor surface.

Source/drain (S/D) terminals refer to the terminals of a FET, between which conduction occurs under the influence of an electric field, subsequent to the inversion of the semiconductor surface under the influence of an electric field resulting from a voltage applied to the gate terminal of the FET. Generally, the source and drain terminals of a FET are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain"

on the basis of the voltage to be applied to that terminal when the FET is operated in a circuit.

The terms contact and via, both refer to structures in a chip used for electrical connection of conductors from different interconnect levels of the chip. These terms are sometimes used in the art to describe both an opening in an insulator in which the structure will be completed, and the completed structure itself. For purposes of this disclosure, contact and via both refer to the completed structure.

Substrate, as used herein, refers to the physical object that is the basic workpiece transformed by various process operations into the desired microelectronic configuration. A typical substrate used for the manufacture of integrated circuits is a wafer. Wafers, may be made of semiconducting (e.g., bulk silicon), non-semiconducting (e.g. glass), or combinations of semiconducting and non-semiconducting materials (e.g., silicon-on-insulator (SOI)). In the semiconductor industry, a bulk silicon wafer is a very commonly used substrate for the manufacture of integrated circuits.

The term vertical, as used herein, means substantially perpendicular to the surface of a substrate.

Overview

Figure 1:
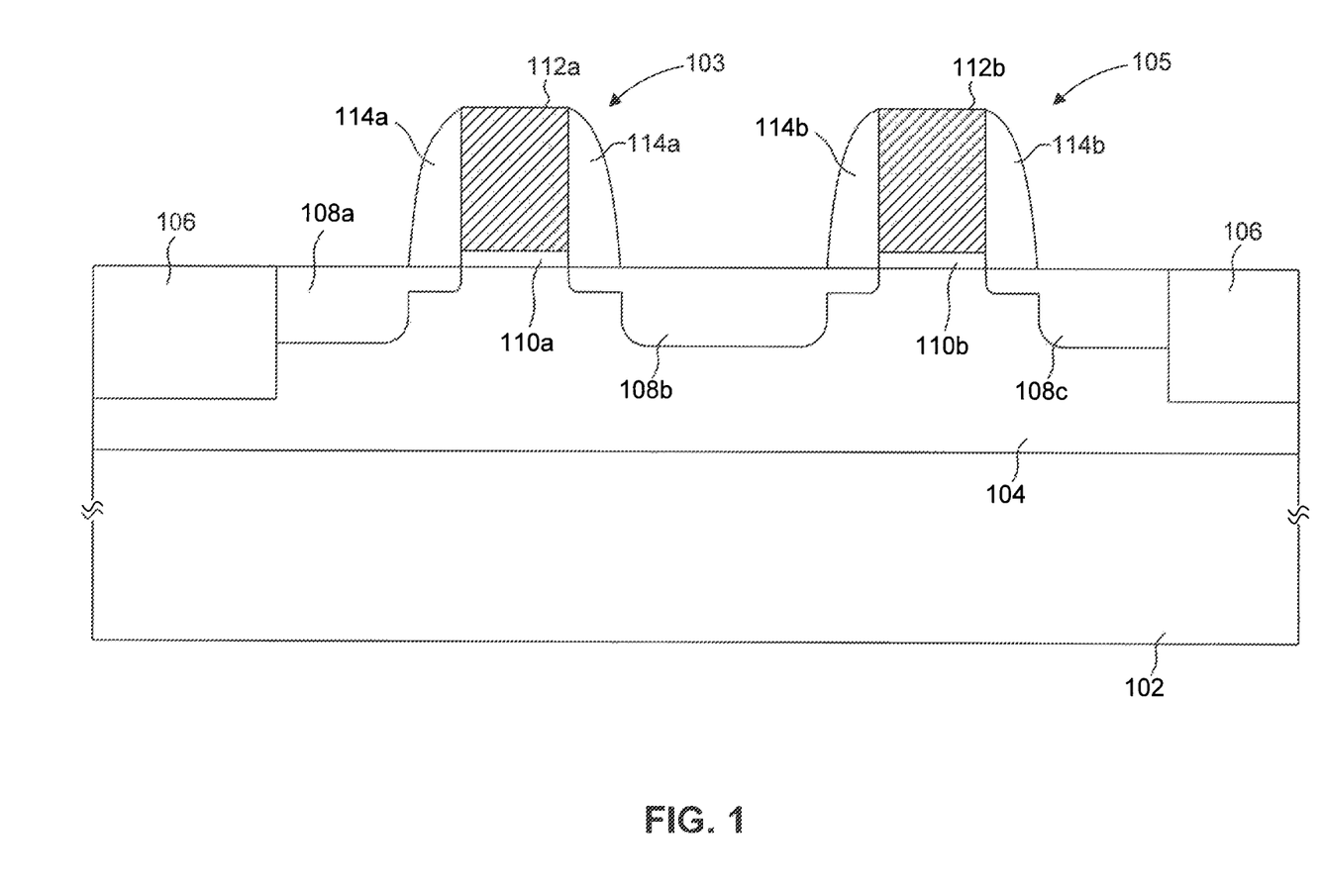
FIG. 1 is a cross-sectional representation of a pair of conventional planar FETs formed on a wafer, the FETs having a nominally uniform gate dielectric thickness with nominally uniform effective oxide thickness, and a channel doping profile that is nominally the same (at a given distance from the surface of the wafer) across the width and length of the FETs.

FIG. 1 is a cross-sectional representation of a pair of conventional planar FETs formed on a wafer, the FETs having a nominally uniform gate dielectric thickness with nominally uniform effective oxide thickness, and a nominally uniform channel doping profile. A wafer 102 has a well 104 of a first conductivity type formed therein. Shallow trench isolation (STI) 106 separates one active region from others. Within the active region defined by STI 106, a first FET 103 and a second FET 105 are formed. FET 103 includes a first S/D terminal 108*a* and second S/D terminal 108*b*, a gate dielectric layer 110*a* and a gate electrode 112*a*. FET 103 is also provided with sidewall spacers 114*a*. FET 105 includes a first S/D terminal 108*b* and second S/D terminal 108*c*, a gate dielectric layer 110*b* and a gate electrode 112*b*. S/D terminals 108*a*, 108*b*, 108*c* are doped with dopants of a second conductivity type. FET 105 is also provided with sidewall spacers 114*b*. As explained in greater detail below, the disadvantages of such a configuration are overcome by various structural and/or manufacturing implementations in accordance with the present disclosure.

At one time in the semiconductor industry it was common for a single entity, such as a corporation, to develop a semiconductor process, design integrated circuits in accordance with the physical and electrical characteristics of that process, and then manufacture those integrated circuits. However, as the cost of building, equipping, and operating semiconductor manufacturing facilities dramatically increased, fewer and fewer entities could afford to both design and manufacture integrated circuits. Because the costs of being a semiconductor manufacturer are so high, great economies of scale are required in order to operate profitably. Consequently, it is common today in the semiconductor industry, to find companies that manufacture but do not design integrated circuits ("foundries"), and companies that design integrated circuits but do not manufacture them ("fabless").

In the semiconductor industry environment of foundries and fabless companies, it is the foundries that develop, specify and provide the physical structures that designers use to implement their designs. Foundries provide manufacturing services to many fabless semiconductor companies, but to operate profitably, they must optimize their manufacturing processes to achieve high yields. Such optimizations typically require that limitations be placed on the variety of structures that can be produced by a particular manufacturing process. Consistent with the foregoing, foundries typically provide a limited set of transistor structures that are intended to cover a broad range of circuit applications. Unfortunately these limited sets of structures do not satisfy every need of integrated circuit designers.

There are many well-known transistor structures that are offered by the foundries. For example, PFETs and NFETs with high threshold voltage (Vt) or low Vt; thick gate dielectric or thin gate dielectric; and various combinations of the foregoing. It is further noted that transistor structures are often adapted for use in a "core" region of a chip, or in an "I/O" (Input/Output) or "peripheral" region of a chip. It is common for FETs used in the core region to have thin gate dielectric layers and to operate at low voltages, whereas it is common for FETs used in the I/O or peripheral regions to have relatively thicker gate dielectric layers and relatively higher operating voltages. Another distinction between core and I/O FETs is that the wells in which the I/O FETs are formed are more heavily doped than the wells in which core FETs are formed. This arrangement allows for high speed operations in the core and for interfacing with signals having higher voltages than can be handled by the low voltage FETs. As explained in greater detail below, some embodiments in accordance with the present disclosure take advantage of the manufacturing operations available in such existing processes to fabricate new transistor structures.

Disclosed herein are the structures of FETs having a unique combination of properties, and methods of making those FETs. A "hybrid" FET, in accordance with the present disclosure, is operable to interface with relatively high voltage signals (similar to I/O transistors), and to simultaneously operate with high $f_T$ (similar to core transistors). It is noted that $f_T$ refers to the frequency at which the small signal gain of the transistor drops to unity. In order to incorporate these two property sets into the same transistor, FETs in accordance with the present disclosure include, under a single gate electrode, (1) a first region of a gate dielectric layer disposed adjacent a first S/D terminal intended for connection to the "high" voltage circuit node and having a first effective oxide thickness; (2) a second region of the gate dielectric layer disposed adjacent a second S/D terminal and having a second effective oxide thickness less than that of the first region; (3) a first portion of a channel region disposed adjacent the first S/D terminal and having a first doping profile; and (4) a second portion of the channel region disposed adjacent the second S/D terminal and having a second doping profile such that this portion is lightly doped relative to the first portion of the channel region; wherein a boundary between the first and second regions of the gate dielectric layer may be aligned with the boundary between channel portions such that the alignment is nominally co-linear, or such that the alignment is nominally biased toward the first S/D terminal, or such that the alignment is nominally biased toward the second S/D terminal.

As noted above, conventional core transistors switch at high speed but operate at low voltage, whereas conventional I/O transistors operate at high voltage but switch at lower speeds. Compared to core transistors, FETs in accordance with the present disclosure advantageously receive high voltage signals while switching at high speed. As compared to I/O transistors, FETs in accordance with the present disclosure switch at high speed while receiving high voltage signals.

Another advantage of FETs in accordance with the present disclosure, is that no additional process operations are needed to construct the inventive transistor structures. A conventional semiconductor process that produces an I/O transistor having a lower well doping concentration relative to a core transistor, and a gate dielectric having a greater effective oxide thickness relative to a core transistor already includes the needed process operations. In order to implement the inventive transistor structures of the present disclosure only newly designed mask layouts are needed to create the inventive arrangement of split channel doping, and split channel gate dielectric effective oxide thickness.

Process

FIGS. 2-5 are cross-sectional representations of a partially fabricated integrated circuit at various stages in an illustrative manufacturing process in accordance with the present disclosure. More particularly, this illustrative process shows the formation of a pair of PFETs that each have a gate dielectric layer with two electrically distinct portions, and that each have a channel region with two electrically distinct portions. As will be explained in greater detail, the present invention is not limited to this illustrative structure or process.

Figure 2:
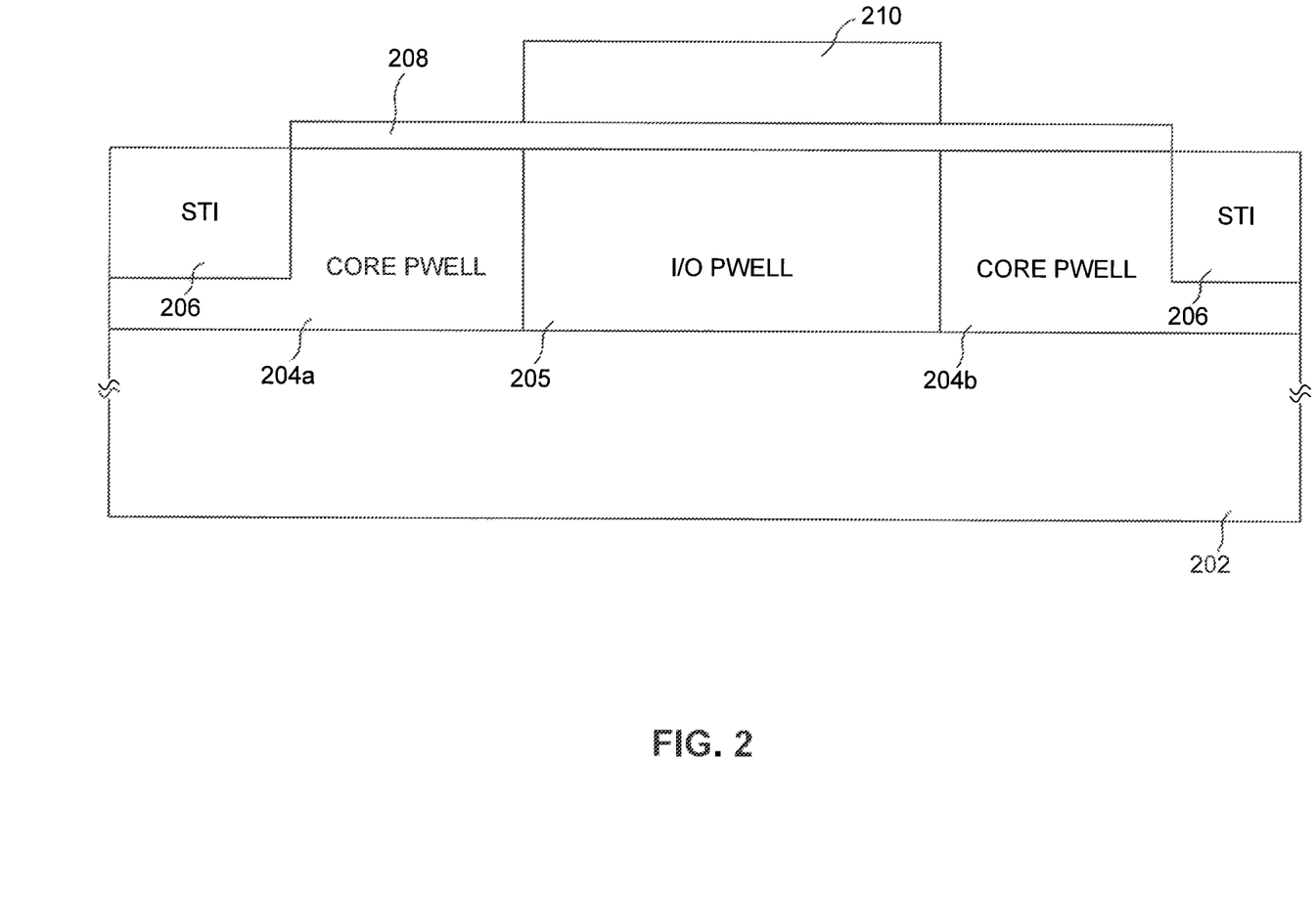
FIG. 2 is a cross-sectional representation of a portion of a partially fabricated integrated circuit on a wafer showing a substrate, a plurality of well regions formed in the substrate, shallow trench isolation structures, a gate dielectric layer disposed superjacent the well regions and a masking layer.

FIG. 2 is a cross-sectional representation of a portion of partially fabricated integrated circuit on a wafer showing a substrate, a plurality of well regions formed in the substrate, shallow trench isolation structures, a gate dielectric layer disposed superjacent the well regions and a masking layer. More particularly, a substrate 202 has wells 204a, 204b formed therein. In this illustrative embodiment, substrate 202 is a silicon wafer, and wells 204a, 204b are p-wells having a first doping profile. Additionally, a p-well 205 is formed in substrate 202. In this illustrative embodiment p-well 205 is disposed between p-wells 204a and 204b. Shallow trench isolation (STI) structures 206 are also formed in substrate 202. STI structures isolate the active areas of p-wells 204a, 204b and 205 from other active areas that are typically formed elsewhere on substrate 202. A gate dielectric layer 208 is disposed over the surface of substrate 202 such that at least the surface regions of p-wells 204a, 204b and 205 are covered by gate dielectric layer 208, which has a predetermined nominal thickness and a predetermined nominal dielectric constant. FIG. 2 further shows a patterned masking layer 210. Masking layer 210 is patterned so that it protects a portion of gate dielectric layer 208 that overlies p-well 205, while other portions of gate dielectric layer 208 are exposed.

Embodiments in accordance with the present disclosure are not limited to specific doping concentrations or specific dopant distribution profiles. In the illustrative configuration shown in FIGS. 2-5, p-well 205 has a greater net concentration of p-type dopants than p-wells 204a, 204b. Oxides of silicon, silicon oxynitrides, stacks of various dielectric materials, and high-k materials such as hafnium oxide may be used for gate dielectric layers. Embodiments in accordance with the present disclosure are not limited a specific material composition for gate dielectric layer 208.

Figure 3:
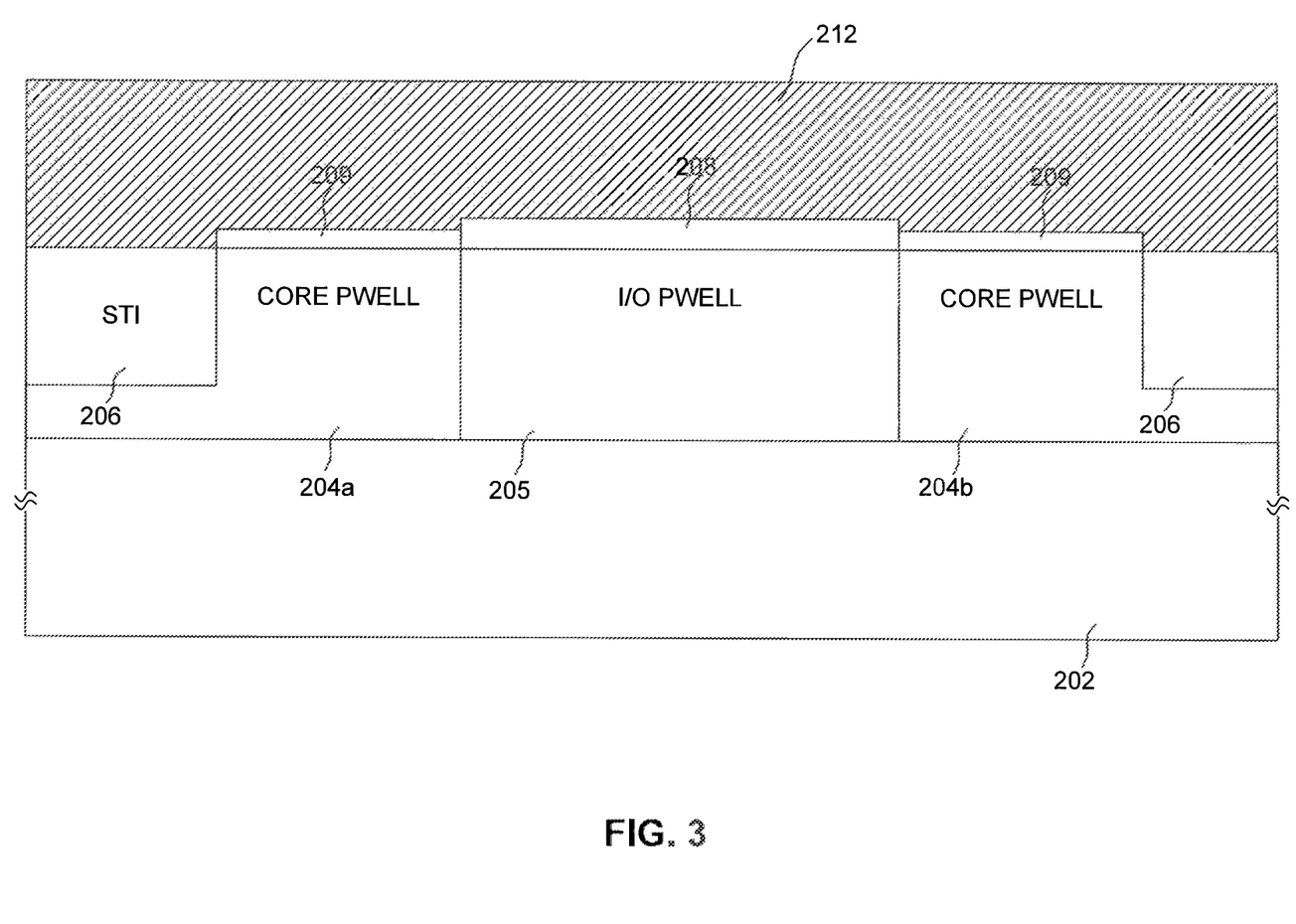
FIG. 3 shows the structure of FIG. 2 after a portion of the gate dielectric layer not covered by the masking layer is removed, a second gate dielectric layer is formed in the areas where the unmasked gate dielectric layer was removed, and a polysilicon layer is disposed over the surface of the substrate.

FIG. 3 shows the structure of FIG. 2 after a portion of gate dielectric layer 208 not covered by masking layer 210 has been removed, a second gate dielectric layer 209 has been formed in the areas where the unmasked gate dielectric layer was removed, and a polysilicon layer 212 is disposed over the surface of the substrate.

Figure 4:
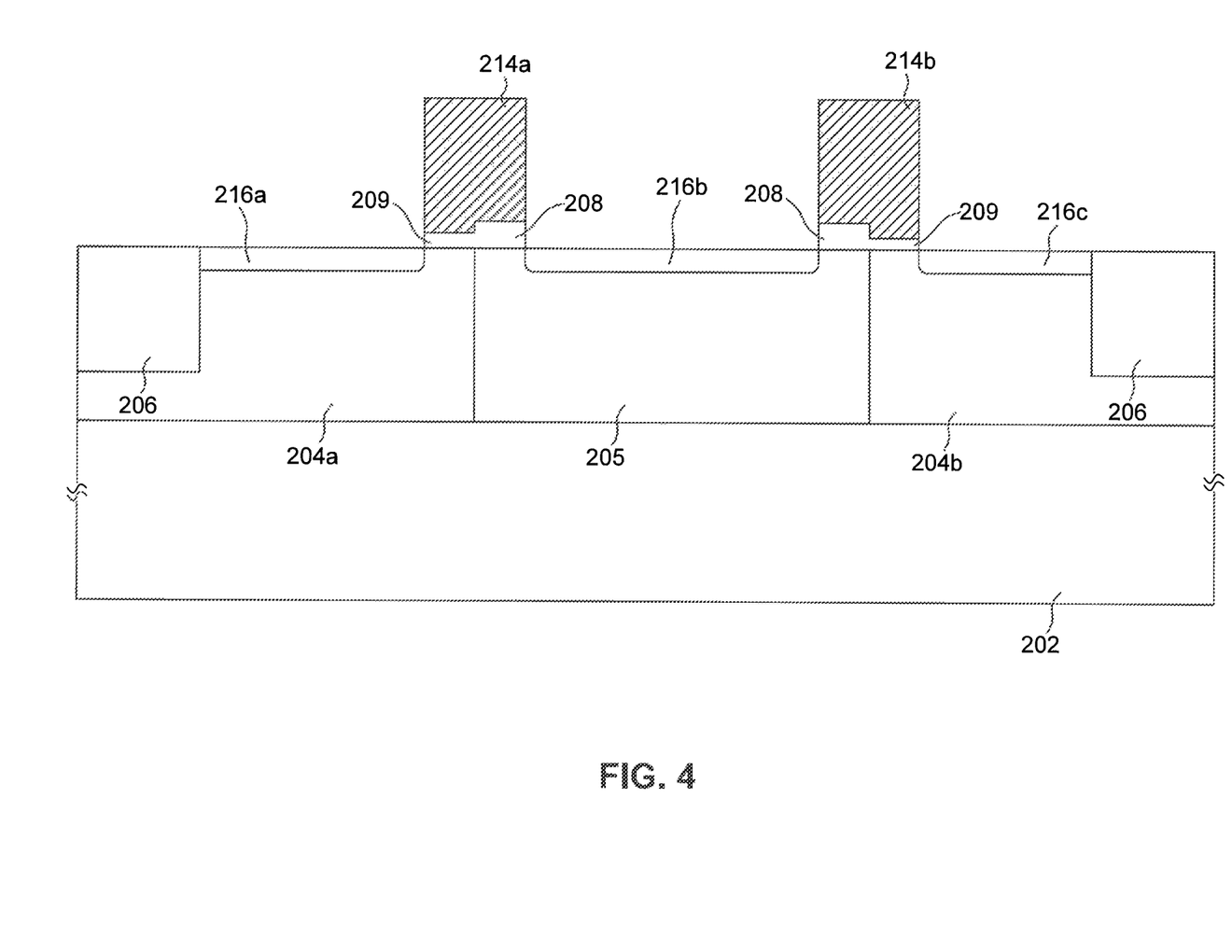
FIG. 4 shows the structure of FIG. 3 after the polysilicon layer is patterned to form a pair of gate electrodes, and the Source/Drain (S/D) extension regions have been implanted.

FIG. 4 shows the structure of FIG. 3 after polysilicon layer 212 is patterned to form a pair of gate electrodes 214a, 214b, and S/D extensions 216a, 216b, 216c have been formed self-aligned to gate electrodes 214a, 214b. Processes for the patterning of a polysilicon layer to form gate electrodes by masking and etching are very well-known in this field and those process details are not further discussed herein. Similarly, the formation of S/D extensions by ion implantation is very well-known in this field and those process details are not further discussed herein. S/D extension dopant ions implanted to form the S/D extensions are of the opposite conductivity type with respect to the conductivity type of the dopant ions used to form wells 204a, 204b, and 205. In this illustrative embodiment, wells 204a, 204b, and 205 are p-wells, doped with a p-type material such as, but not limited to, boron (B), and S/D extensions are doped with an n-type material, such as, but not limited to, arsenic (As).

Figure 5:
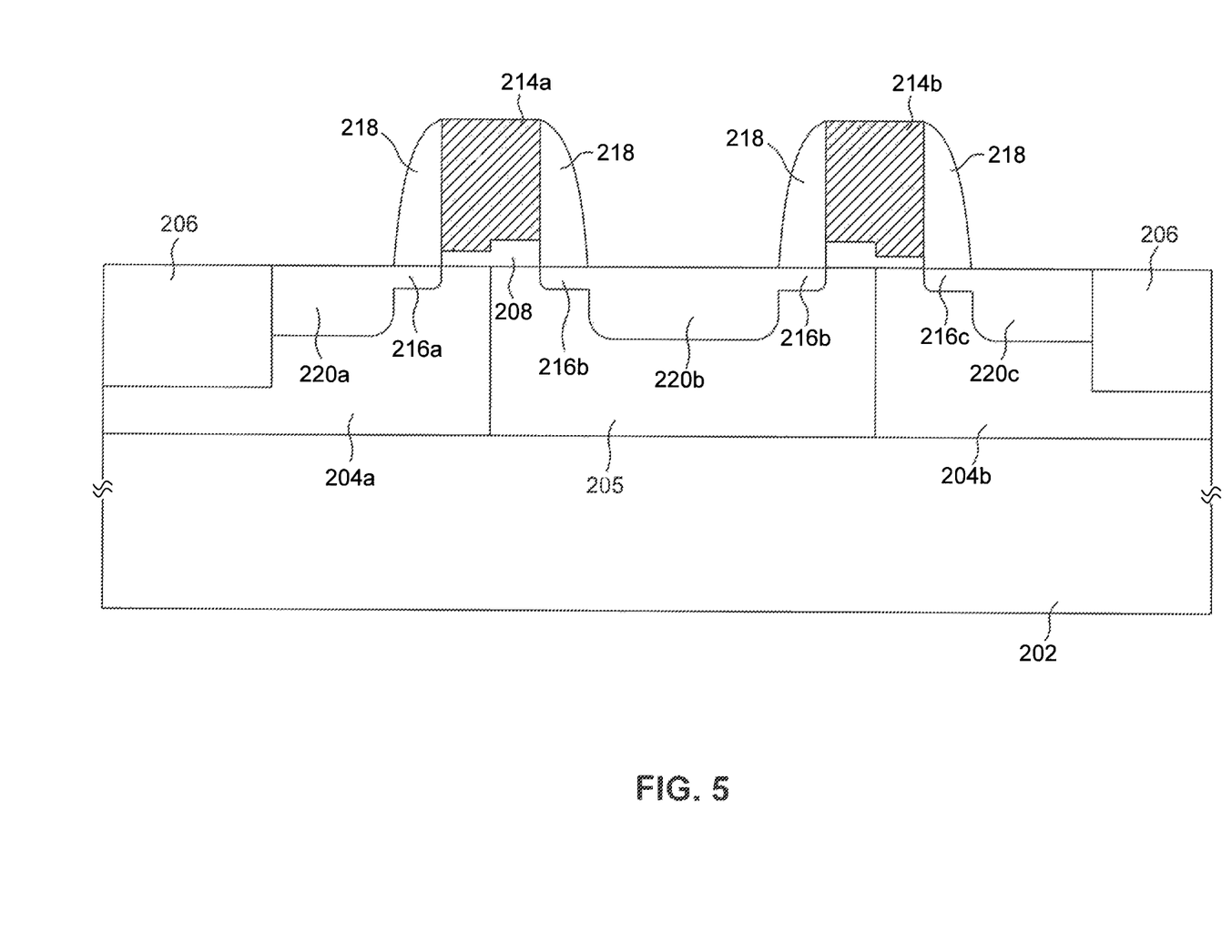
FIG. 5 shows the structure of FIG. 4 after sidewall spacers are formed adjacent the gate electrodes, and the S/D regions have been implanted.

FIG. 5 shows the structure of FIG. 4 after sidewall spacers 218 are formed adjacent gate electrodes 214a, 214b, and S/D regions 220a, 220b, 220c have been formed self-aligned to sidewall spacers 218. S/D regions 220a, 220b, 220c have a conductivity type opposite to that of wells 204a, 204b, 205. In this illustrative embodiment, S/D regions 220a, 220b, 220c are implanted with n-type dopants. Processes for the formation of sidewall spacers are very well-known in this field and those process details are not further discussed herein. Processes for the formation of S/D regions 220a, 220b, 220c are very well-known in this field and those process details are not further discussed herein. Those skilled in the art can select the implant species, doses and energies for forming the S/D regions without undue experimentation.

FIGS. 6-9 show cross-sectional representations of various illustrative FETs in accordance with the present disclosure. There are several structural elements and electrical parameters that can be varied within the scope of the present disclosure. A list of structural elements and electrical parameters includes, but is not necessarily limited to, (1) the physical thickness of each of the first and second regions of the gate dielectric layer relative to each other; (2) the electrical thickness of each of the first and second regions of the gate dielectric layer relative to each other; (3) the relative location of the boundary between the first and second regions of the gate dielectric layer and the boundary between the first and second portions of the channel region; and (4) the conductivity types of the wells and the S/D terminals.

Figures 6, 7:
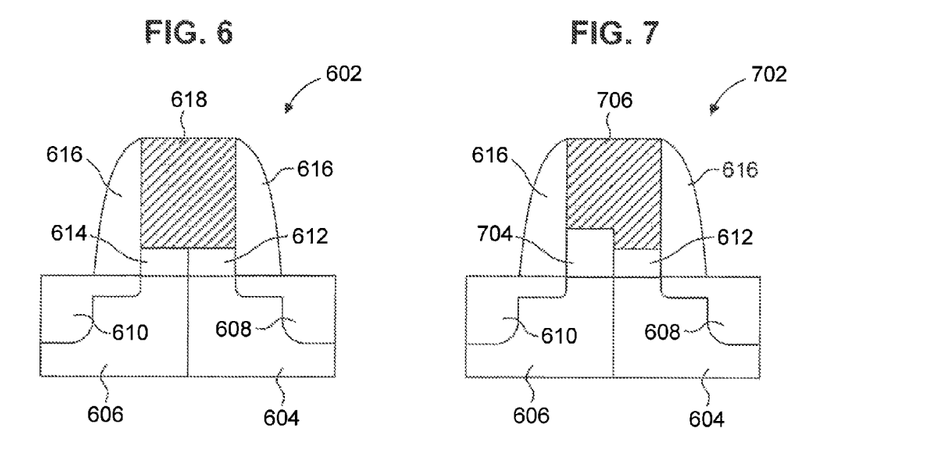
FIG. 6 is a cross-sectional representation of a FET in accordance with the present disclosure, including a channel region having a first region with a first doping profile and a second region with a second doping profile; and a gate dielectric layer having a first region with a first effective oxide thickness and a second region with a second effective oxide thickness, wherein the location of the boundary between the first and second channel regions is substantially aligned with the boundary between the first and second gate dielectric regions, and the first effective oxide thickness is greater than the second effective oxide thickness.
FIG. 7 is a cross-sectional representation of a FET in accordance with the present disclosure, including a channel region having a first region with a first doping profile and a second region with a second doping profile; and a gate dielectric layer having a first region with a first effective oxide thickness and a second region with a second effective oxide thickness, wherein the location of the boundary between the first and second channel regions is substantially aligned with the boundary between the first and second gate dielectric regions, the first effective oxide thickness is greater than the second effective oxide thickness, and the second gate dielectric layer is physically thicker than the first gate dielectric region.

FIG. 6 is a cross-sectional representation of an illustrative FET 602 in accordance with the present disclosure, including a channel region having a first portion 604 with a first doping profile, a second portion 606 with a second doping profile; and a gate dielectric layer having a first region 612 with a first effective oxide thickness and a second region 614 with a second effective oxide thickness, wherein the location of the boundary between first channel portion 604 and second channel portion 606 is substantially aligned with the boundary between first gate dielectric regions 612 and second gate dielectric region 614. The first effective oxide thickness is greater than the second effective oxide thickness. FET 602 further includes a gate electrode 618, and sidewall spacers 616. S/D terminals 608, 610 are self-aligned to sidewall spacers 616 (and the S/D extensions are self-aligned to gate electrode 618 as shown in FIG. 6). FET 602 illustrates an embodiment in which first region 612 and second region 614 of the gate dielectric layer have nominally the same physical thickness, but second region 614 has a dielectric constant greater than that of first region 612; therefore second region 614 has a smaller effective oxide thickness.

FIG. 7 is a cross-sectional representation of another illustrative FET 702 in accordance with the present disclosure, including a channel region having a first portion 604 with a first doping profile and a second portion 606 with a second doping profile; and a gate dielectric layer having a first region 612 with a first effective oxide thickness and a second region 704 with a second effective oxide thickness, wherein the location of the boundary between the first and second channel regions is substantially aligned with the boundary between the first and second gate dielectric regions 612, 704, the first effective oxide thickness is greater than the second effective oxide thickness, and the second gate dielectric region 704 is physically thicker than the first gate dielectric region 612.

Figure 8:
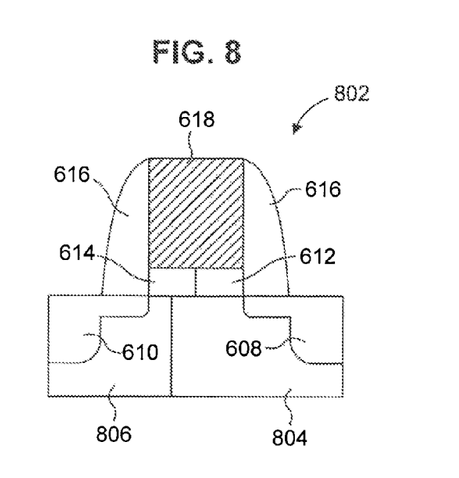
FIG. 8 is a cross-sectional representation of a FET in accordance with the present disclosure, including a channel region having a first region with a first doping profile and a second region with a second doping profile; and a gate dielectric layer having a first region with a first effective oxide thickness and a second region with a second effective oxide thickness, wherein the location of the boundary between the first and second channel regions is shifted with respect to the boundary between the first and second gate dielectric regions, such that the channel region boundary is located under the second portion of the gate dielectric layer; the first effective oxide thickness is greater than the second effective oxide thickness.

FIG. 8 is a cross-sectional representation of a further illustrative FET 802 in accordance with the present disclosure, including a channel region having a first portion 804 with a first doping profile and a second region 806 with a second doping profile; and a gate dielectric layer having a first region 612 with a first effective oxide thickness and a second region 614 with a second effective oxide thickness, wherein the location of the boundary between the first channel region 804 and second channel region 806 is shifted with respect to the boundary between the first gate dielectric region 612 and second gate dielectric region 614, such that the channel region boundary is located under the second region 614 of the gate dielectric layer; the first effective oxide thickness is greater than the second effective oxide thickness.

Figure 9:
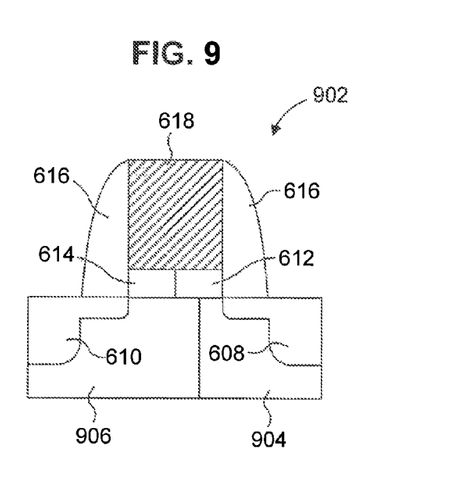
FIG. 9 is a cross-sectional representation of a FET in accordance with the present disclosure, including a channel region having a first region with a first doping profile and a second region with a second doping profile; and a gate dielectric layer having a first region with a first effective oxide thickness and a second region with a second effective oxide thickness, wherein the location of the boundary between the first and second channel regions is shifted with respect to the boundary between the first and second gate dielectric regions, such that the channel region boundary is located under the first portion of the gate dielectric layer; the first effective oxide thickness is greater than the second effective oxide thickness.

FIG. 9 is a cross-sectional representation of a still further illustrative FET 902 in accordance with the present disclosure, including a channel region having a first portion 904 with a first doping profile and a second portion 906 with a second doping profile; and a gate dielectric layer having a first region 612 with a first effective oxide thickness and a second region 614 with a second effective oxide thickness, wherein the location of the boundary between the first 904 and second 906 channel portions is shifted with respect to the boundary between first 612 and second 614 gate dielectric regions, such that the channel region boundary is located under first region 612 of the gate dielectric layer; the first effective oxide thickness is greater than the second effective oxide thickness, and first portion 904 is more heavily doped than second portion 906.

Those skilled in the art and having the benefit of this disclosure will recognize that only conventional process operations are needed to complete an integrated circuit subsequent to the formation of FETs in accordance with the present disclosure. That is, the formation of contacts, vias, interconnect metal, inter-layer dielectrics, pads, and packaging may all proceed in accordance with conventional semiconductor manufacturing steps since these steps are not material to the construction or electrical characteristics of the inventive FETs disclosed herein.

It is noted that both PFETs and NFETs may be implemented in accordance with the present invention. Those skilled in the art will recognize that the dopant conductivity types of the source/drain terminals and the transistor body are reversed as between PFETs and NFETs.

In one illustrative structure, a FET, includes a first S/D terminal; a second S/D terminal spaced apart from the first S/D terminal; a channel region disposed between the first S/D terminal and the second S/D terminal; a gate dielectric structure disposed superjacent the channel region; and a gate electrode disposed superjacent the gate dielectric structure; wherein the gate dielectric structure has a first region having a first thickness and a second region having a second thickness; wherein the channel region has a first portion having a first doping profile, the first portion adjacent to the first S/D terminal, and the channel region further has a second portion having a second doping profile, the second portion adjacent to the second S/D terminal. In some embodiments the first thickness is less than the second thickness. In other embodiments, the first portion of the channel region has a net concentration of dopants of a first conductivity type that is lower than a net concentration of dopants of the first conductivity type in the second portion of the channel region. In some embodiments, a substantial part of the first region of the gate dielectric structure is disposed superjacent the first portion of the channel region and a substantial part of the second region of the gate dielectric structure is disposed superjacent the second portion of the channel region.

In another illustrative structure, a FET, includes a first S/D terminal; a second S/D terminal spaced apart from the first S/D terminal; a channel region disposed between the first S/D terminal and the second S/D terminal, the channel region having a first portion with a first doping profile and a second portion with a second doping profile, the first portion of the channel region disposed adjacent to the first S/D terminal and the second portion of the channel region disposed adjacent to the second S/D terminal; a gate dielectric structure disposed superjacent the channel region, the gate dielectric structure having a first portion with a first effective oxide thickness and a second portion with a second effective oxide thickness; and a gate electrode disposed superjacent the gate dielectric structure; wherein the first portion of the channel region and the second portion of the channel region are both of the same conductivity type, and the effective concentration of dopants of the first conductivity type in the first portion of the channel region is less than the effective concentration of dopants of the first conductivity type in the second portion of the channel region; wherein the first effective oxide thickness is less than the second effective oxide thickness.

Figure 10:
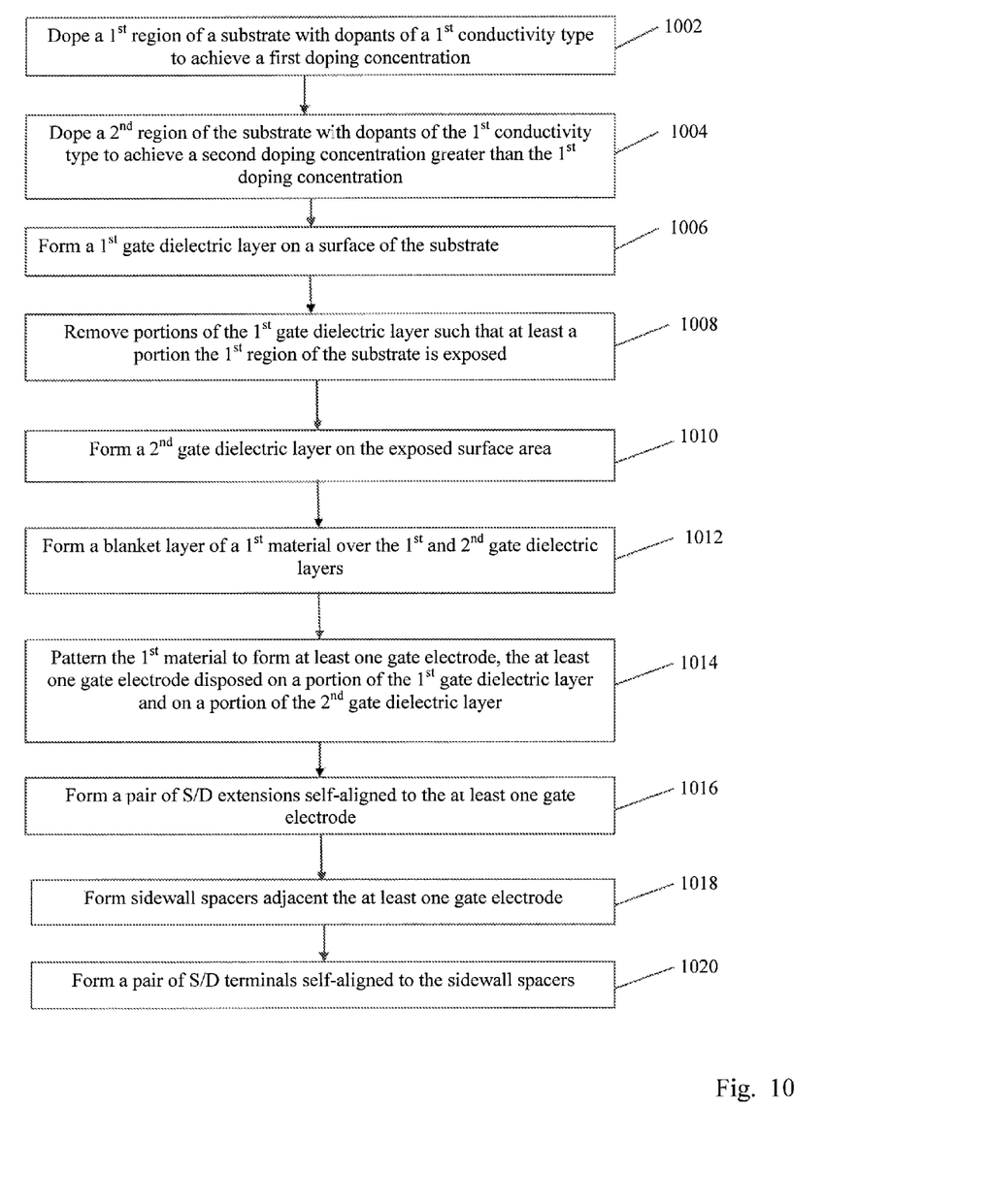
FIG. 10 is a flow diagram of an illustrative process in accordance with the present invention.

FIG. 10 shows a flow diagram of an illustrative process in accordance with the present disclosure. In this illustrative process, a method of manufacturing a FET, includes a step 1002 of doping a first portion of a substrate with dopants of a first conductivity type. At step 1004 a second portion of the substrate is doped with dopants of the first conductivity type. At step 1006 a first gate dielectric layer is formed on a surface of the substrate At step 1008 portions of the first gate dielectric layer are removed such that corresponding portions of the surface are exposed. At step 1010 a second gate dielectric layer is formed on the exposed surface area. At step 1012 a blanket layer of a first material is formed over the first and second gate dielectric layers. At step 1014 the first material is patterned to form at least one gate electrode, the at least one gate electrode disposed on a portion of the first gate dielectric layer and on a portion of the second gate dielectric layer. At step 1016 a pair of source/drain extensions is formed to be self-aligned to the at least one gate electrode. At step 1018 sidewall spacers are formed adjacent the at least one gate electrode. And at step 1020 a pair of S/D terminals are formed to be self-aligned with the sidewall spacers. It is noted that the first portion of the substrate has an effective doping concentration less that an effective doping concentration of the second portion of the substrate. In some embodiments, the first dielectric layer and the second dielectric have different dielectric constants and the same thickness. In other embodiments, the first dielectric layer the second dielectric layer have the same dielectric constants and different thicknesses.

CONCLUSION

It is to be appreciated that the Detailed Description section, and not the Abstract of the Disclosure, is intended to be used to interpret the Claims. The Abstract of the Disclosure may set forth one or more, but not all, embodiments of the invention, and thus, is not intended to limit the invention and the subjoined Claims in any way.

It will be apparent to those skilled in the relevant art(s) that various changes in form and detail can be made therein without departing from the spirit and scope of the invention. Thus the invention should not be limited by any of the above-described illustrative embodiments, but should be defined in accordance with the subjoined Claims and their equivalents.

What is claimed is:

1. A field effect transistor (FET), comprising:
a first source/drain (S/D) terminal;

a second S/D terminal spaced apart from the first S/D terminal;

a channel region disposed between the first S/D terminal and the second S/D terminal;

a gate dielectric structure disposed superjacent the channel region; and a gate electrode disposed superjacent the gate dielectric structure;

wherein the gate dielectric structure has a first region adjacent to the first S/D terminal having a first thickness and a second region adjacent to the second S/D terminal having a second thickness;

wherein the channel region has a first portion adjacent to the first S/D terminal having a first doping profile, and the channel region further has a second portion adjacent to the second S/D terminal having a second doping profile different from the first doping profile;

wherein the first thickness is less than the second thickness;

wherein the first portion of the channel region has a net concentration of dopants of a first conductivity type that is lower than a net concentration of dopants of the first conductivity type in the second portion of the channel region.

2. The FET of claim 1, wherein a substantial part of the first portion of the gate dielectric structure is disposed superjacent the first portion of the channel region.

3. The FET of claim 1, wherein a substantial part of the second portion of the gate dielectric structure is disposed superjacent the second portion of the channel region.

4. A field effect transistor (FET), comprising:
a first source/drain (S/D) terminal;
a second S/D terminal spaced apart from the first S/D terminal;
a channel region disposed between the first S/D terminal and the second S/D terminal, the channel region having a first portion disposed adjacent to the first S/D terminal with a first doping profile and a second portion disposed adjacent to the second S/D terminal with a second doping profile which is different from the first doping profile;
a gate dielectric structure disposed superjacent the channel region, the gate dielectric structure having a first region adjacent to the first S/D terminal with a first effective oxide thickness and a second region adjacent to the second S/D terminal with a second effective oxide thickness; and
a gate electrode disposed superjacent the gate dielectric structure;
wherein the first portion of the channel region and the second portion of the channel region are both of a first conductivity type, and an effective concentration of dopants of the first conductivity type in the first portion of the channel region is less than an effective concentration of dopants of the first conductivity type in the second portion of the channel region; and
wherein the first effective oxide thickness is less than the second effective oxide thickness.

5. The FET of claim 4, wherein the first region of the gate dielectric structure is thinner than the second region of the gate dielectric structure.

6. The FET of claim 4, wherein the first region of the gate dielectric structure and the second region of the gate dielectric structure have the same thickness.

7. The FET of claim 4, wherein the first region of the gate dielectric structure is thicker than the second region of the gate dielectric structure.

8. The FET of claim 5, wherein the first region of the gate dielectric structure has a dielectric constant that is substantially the same as a dielectric constant of the second region of the gate dielectric structure.

9. The FET of claim 6, wherein the first region of the gate dielectric structure has a dielectric constant that is greater than a dielectric constant of the second region of the gate dielectric structure.

10. The FET of claim 7, wherein the first region of the gate dielectric structure has a dielectric constant that is greater than a dielectric constant of the second region of the gate dielectric structure.

11. The FET of claim 4, wherein the FET is formed as part of an integrated circuit, the integrated circuit having at least a first set of wells of a first well conductivity type and a first well doping profile, and a second set of wells of the first well conductivity type and a second well doping profile;
wherein the first well doping profile and the second well doping profile are different from each other.

12. The FET of claim 11, wherein the first portion of the channel region has a doping profile that is nominally the same as the first well doping profile.

13. The FET of claim 11, wherein the second portion of the channel region has a doping profile that is nominally the same as the second well doping profile.

14. A field effect transistor (FET), comprising:
a first source/drain (S/D) terminal;
a second S/D terminal spaced apart from the first S/D terminal;
a channel region disposed between the first and second S/D terminals, the channel region having a first portion disposed adjacent to the first S/D terminal, a second portion disposed adjacent to the second S/D terminal, and the first portion and the second portions are disposed adjacent to each other at a channel region portion boundary;
a gate dielectric structure disposed on the channel region, the gate dielectric structure having a first region adjacent to the first S/D terminal with a first effective oxide thickness and a second region adjacent to the second S/D terminal with a second effective oxide thickness, the first and second gate dielectric regions disposed adjacent to each other at a gate dielectric region boundary; and
a gate electrode disposed on the gate dielectric structure;
wherein the first effective oxide thickness is less than the second effective oxide thickness, the first and second portions of the channel region are of the same conductivity type, and an effective concentration of dopants of a first conductivity type in the first portion of the channel region is less than an effective concentration of dopants of the first conductivity type in the second portion of the channel region.

15. The FET of claim 14, wherein the channel region portion boundary is substantially aligned with the gate dielectric region boundary.

16. The FET of claim 14, wherein the channel region portion boundary is aligned such that it is shifted away from the gate dielectric region boundary and towards the first S/D terminal.

17. The PET of claim 14, wherein the channel region portion boundary is aligned such that it is shifted away from the gate dielectric region boundary and towards the second S/D terminal.

18. The FET of claim 14, wherein:
the channel region portion boundary is aligned such that it is shifted away from the gate dielectric region boundary and towards one of the first and second S/D terminals;

the first portion of the channel region has a first doping profile; and the second portion of the channel region has a second doping profile, different from the first doping profile.

* * * * *